United States Patent [19]
Hahn et al.

[11] Patent Number: 5,359,447
[45] Date of Patent: Oct. 25, 1994

[54] OPTICAL COMMUNICATION WITH VERTICAL-CAVITY SURFACE-EMITTING LASER OPERATING IN MULTIPLE TRANSVERSE MODES

[75] Inventors: Kenneth H. Hahn, Cupertino; Michael R. T. Tan, Mountain View; Shih-Yuan Wang, Palo Alto, all of Calif.

[73] Assignee: Hewlett-Packard Company, Palo Alto, Calif.

[21] Appl. No.: 83,739

[22] Filed: Jun. 25, 1993

[51] Int. Cl.$^5$ .................................. H04B 10/00
[52] U.S. Cl. .................................. 359/154; 359/173; 372/38
[58] Field of Search ............... 359/154, 161, 173, 180, 359/188, 195; 372/38, 45

[56] References Cited

U.S. PATENT DOCUMENTS

| | | | |
|---|---|---|---|
| 5,025,487 | 6/1991 | Eichen | 359/154 |
| 5,125,054 | 6/1992 | Ackley et al. | 385/49 |
| 5,140,452 | 8/1992 | Yamamoto et al. | 359/154 |
| 5,224,183 | 6/1993 | Dugan | 359/161 |
| 5,249,245 | 9/1993 | Lebby et al. | 385/89 |

OTHER PUBLICATIONS

Banwell et al. "VCSE Laser Transmitters for Parallel Data Lines", IEEE Journal of Quantum Electronics, vol. 29, No. 2, Feb. 1993.

*Primary Examiner*—Richard E. Chilcot, Jr.
*Assistant Examiner*—Kinfe-Michael Negash

[57] ABSTRACT

An optical communication system using a relatively large-area vertical-cavity surface-emitting laser. The laser has an opening larger than about eight micrometers and is coupled to a multimode optical fiber. The laser is driven into multiple transverse mode operation, which includes multiple filamentation as well as operation in a single cavity.

6 Claims, 2 Drawing Sheets

OPTICAL COMMUNICATION WITH VERTICAL-CAVITY SURFACE-EMITTING LASER OPERATING IN MULTIPLE TRANSVERSE MODES

BACKGROUND OF THE INVENTION

The present invention relates generally to optical transmission of signals and more particularly to an optical communication network of the kind having a multimode optical fiber that receives a multiple mode beam of light from a vertical-cavity, surface-emitting laser being operated in multiple modes or multiple filamentation.

Optical communication systems are used to carry information from one location to another. One of the advantages of optical systems is that they have extremely wide bandwidths. This means that optical systems can carry much more information than can other kinds of communication systems such as radio or microwave. For example, nearly all long-distance telephone calls are carried by optical communication systems because a single optical fiber can carry thousands of conversations at the same time. Optical systems also offer the potential of carrying large quantities of digital data for high-speed computers more efficiently and economically than other communication systems.

Every optical communication system includes, at a minimum, three elements: a transmitter that generates a beam of light and modulates the beam with data to be transmitted, a receiver that receives the beam of light and recovers the data from it, and a medium such as an optical fiber that carries the beam of light from the transmitter to the receiver. Typically the transmitter uses a laser or a light-emitting diode ("LED") to generate the light beam. The receiver uses photodetectors or the like to receive the beam. The medium may be an optical waveguide or the like instead of an optical fiber.

Light may travel through an optical medium in single mode or multiple modes. In general, a "mode" of an electromagnetic wave can be defined as a stationary pattern of the wave. In the special case of a beam of light (which may be thought of as an electromagnetic wave in the optical portion of the spectrum), a mode is a wave pattern that does not change the shape of its transverse field distribution as it propagates through the medium.

A given optical medium may be capable of supporting many modes or only a single mode. This is determined by physical parameters such as—in the case of an optical fiber—the diameter of the fiber and the difference between the indices of refraction of the core and the cladding.

Likewise, many lasers can be caused to operate in single mode or in multiple modes. This can be done by a suitable choice of device structure and drive conditions. Multiple mode operation has generally been understood to consist of multiple modes in one laser cavity. However, studies have shown that multiple mode laser operation can occur with filamentation due to non-uniform gain or loss. This is especially true for lasers with large transverse dimensions compared with the wavelength. For convenience, the terms "multiple mode" and "multimode" as used herein to describe the operation of a laser will include both multiple modes in a single laser cavity and multiple filamentation.

Optical communication systems are subject to various kinds of losses and limitations. Among these are intermodal dispersion, chromatic dispersion and mode selective losses. All of these have the effect of decreasing the signal-to-noise ratio, and therefore it is desirable to eliminate or minimize them as much as possible.

Intermodal dispersion becomes worse as the length of the fiber increases. Intermodal dispersion only affects multimode fibers, and therefore single mode fibers are preferred for communication over long distances. As used herein, a "long" distance means a distance that is more than a few hundred meters and a "short" distance is one that is less than a few hundred meters. Of course, it should be understood that this is an approximation; multimode fibers up to a few kilometers in length have been used successfully, but usually when the required length of the fiber exceeds a couple of hundred meters a single mode fiber will be used.

Chromatic dispersion also becomes more severe as the length of the fiber increases but, unlike intermodal dispersion, chromatic dispersion affects both single mode and multimode fibers. The adverse effects of chromatic dispersion can be minimized by using a highly coherent laser because such a laser produces a light beam of very narrow spectral width. Accordingly, highly coherent lasers have been preferred for most optical communication systems, especially for communication over long distances.

Of course, single mode optical fibers can also be used over short distances (less than a few hundred meters), for example to carry digital data from one computer to another in a local network or even to carry data between points less than a meter apart within a single computer. However, multimode optical fibers are preferred for short-distance optical communication systems because their relative ease of packaging and alignment makes them considerably less expensive than single mode fibers.

A drawback of multimode optical media has been that these media are subject to mode selective losses. A mode selective loss may be characterized as a physical condition that affects the optical characteristics of the medium. These losses may be, for example, splices in the medium, power splitters and other devices that are connected to the medium, and physical defects such as poor quality connections and misalignment of components. Although such physical conditions can be reduced by careful design and construction, in practice it is rarely possible to produce a system that is totally free of them. Therefore, all practically realizable multimode optical communication systems will be subject to at least some mode selective losses.

The actual mechanism by which physical discontinuities produce mode selective losses will now be briefly discussed. Interference between different modes in a multimode medium carrying a coherent light beam produces a speckle pattern. Ideally this speckle pattern would remain stationary, but in practice it moves about within the medium. Speckle pattern movement may be caused by physical jostling or other movement of the fiber itself (relatively slow movement) or by laser mode partitioning and the like (relatively fast movement). Movement of the speckle pattern in a system having mode selective losses results in power variations in the received signal. These variations are caused by the mode selective losses and result in a degradation of the signal-to-noise ratio. In digital systems, a degradation of the signal-to-noise ratio manifests itself as an increased bit error rate.

Mode selective losses are described in more detail in such references as Epsworth, R. E., "The Phenomenon of Modal Noise in Analogue and Digital Optical Fibre Systems", *Proceedings of the 4th European Conference on Optical Communications*, Genoa, September, 1978, pp. 492–501, and in Kanada, T., "Evaluation of Modal Noise in Multimode Fiber-Optic Systems", *IEEE Journal of Lightwave Technology*, 1984, LT-2, pp. 11–18.

Mode selective losses can be avoided by using a relatively low-coherence light source such as an LED or a self-pulsating laser diode ("SPLD") rather than a highly coherent laser. The use of LEDs in optical communication systems is described in Soderstrom, R., et al., "Low Cost High Performance Components of Computer Optical Data Links", *Proceedings of the IEEE Laser and Electrooptics Society Meeting*, Orlando, Fla. 1989. A disadvantage of using LEDs in optical communication systems is that the coupling efficiency between an LED and an optical fiber is very low. In addition, LEDs are inherently slow, which limits the maximum data rate.

SPLDs have been used in such systems as the Hewlett-Packard HOLC-0266 Mbaud Fiber Channel multimode fiber data link, manufactured by the assignee hereof; this is described in Bates, R. J. S., "Multimode Waveguide Computer Data Links with Self-Pulsating Laser Diodes", *Proceedings of the International Topical Meeting on Optical Computing*, Kobe, Japan, April, 1990, pp. 89–90. The coupling efficiency between an SPLD and an optical fiber is better than that between an LED and an optical fiber, but still is not optimal. In addition, the maximum data rate that can be achieved with an SPLD is limited. Neither SPLD nor LED systems have been able to achieve reliable data rates as high as 1 gigabit per second From the foregoing it will be apparent that there remains a need for a reliable and economical way to carry data at rates exceeding one gigabit per second by means of optical communication systems operating over short distances.

SUMMARY OF THE INVENTION

The present invention provides an optical communication system that can transmit data reliably and economically by means of multimode optical media at any rate up to and exceeding one gigabit per second.

Briefly and in general terms, the invention is embodied in an optical communication system having a vertical-cavity, surface-emitting laser ("SEL"). A multimode optical medium such as an optical fiber is coupled to the SEL. A power supply provides a bias current that drives the SEL into multiple transverse mode operation, preferably in more than two distinct modes. The SEL generates a beam of light that has a lower coherence than that provided by a single-mode laser. This beam of light is modulated with data carried by an incoming signal. The SEL preferably has an aperture larger than about eight micrometers ("μm") through which the modulated light beam is emitted.

The optical medium carries the modulated beam of light from the SEL to a receiver at a remote location. The receiver, which may be closer than a meter or farther away than 100 meters, recovers the data from the light beam.

Other aspects and advantages of the invention will become apparent from the following detailed description, taken in conjunction with the accompanying drawings, illustrating by way of example the principles of the invention.

DESCRIPTION OF THE PREFERRED EMBODIMENT

Figure 1:
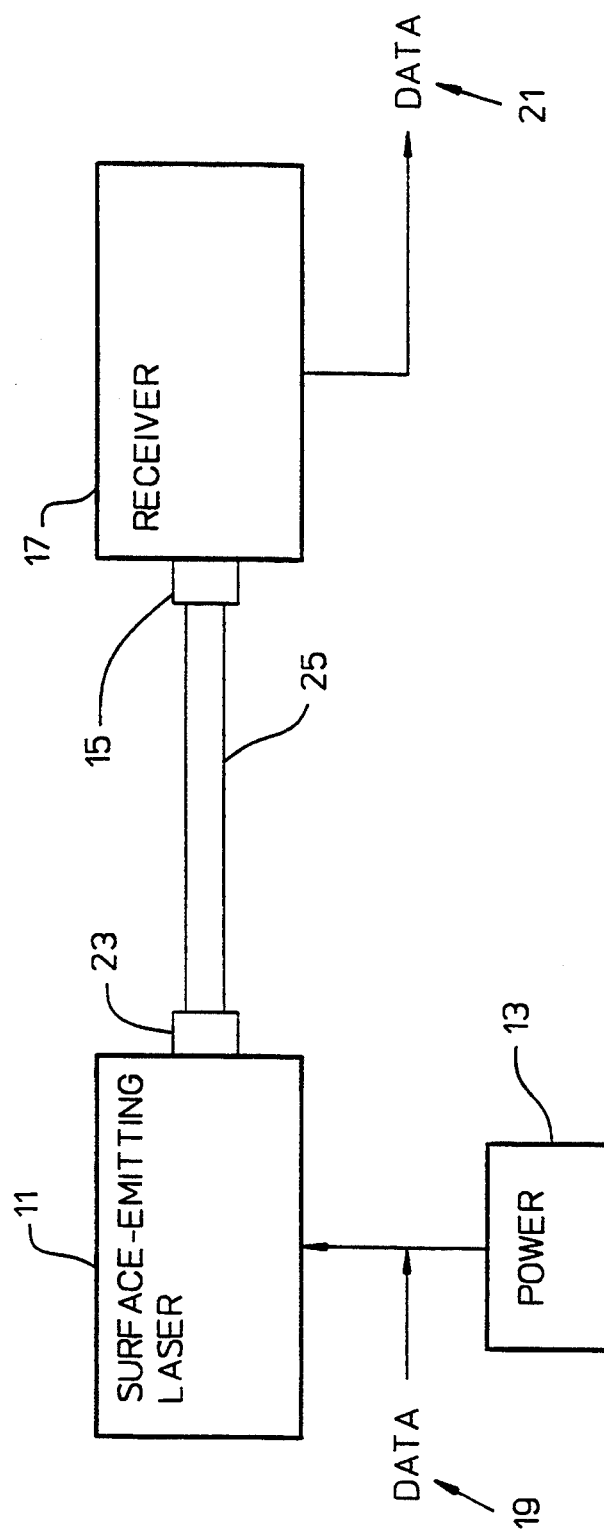
FIG. 1 is a schematic diagram of a preferred embodiment of an optical communication system according to the invention.

As shown in the drawings for purposes of illustration, the invention is embodied in a novel optical communication system having a vertical-cavity, surface-emitting laser ("SEL") driven into multiple transverse mode operation to provide a light beam that carries data reliably and efficiently over a multimode optical medium. To avoid the expense of single mode fibers for communicating over distances of less than a few hundred meters, existing optical communication systems have used multimode fibers, but such systems have been subject to unacceptably high mode selection losses or have used low-coherence light sources such as LEDs and SPLDs that have not been able to achieve sufficiently high data rates.

A communication system according to the invention uses an SEL operating in multiple transverse modes. The SEL provides a beam of light that has lower coherence than the highly-coherent light beams typically used in single mode systems but higher coherence than the low-coherence beams provided by LEDs and self-pulsating lasers. A multimode optical medium carries the beam from the SEL to a receiver which may be less than a meter away or 100 meters or more distant. The system can transmit data at any rate up to and exceeding 1.5 gigabits per second with a negligible bit error rate. The system provides all the benefits, such as easy alignment, simple packaging and low cost, usually associated with multimode optical media.

A preferred embodiment of the invention will now be discussed in more detail. As shown in FIG. 1, the invention is embodied in an optical communication network that includes an SEL 11, a power supply 13 that provides a bias current to drive the SEL into multiple transverse mode operation, and a multimode optical medium 15 optically coupled to the SEL to carry the optical signal from the SEL to a remotely-located receiver 17. The SEL is responsive to a signal carrying data (designated generally as 19) to provide an optical signal modulated with the data. The receiver 17, which is optically coupled to the optical medium 15, receives the modulated optical signal and recovers the data (designated generally as 21) therefrom.

Various kinds of multimode optical media such as optical fibers and waveguides may be used for the medium 15. The SEL 11 and the receiver 17 are coupled to the medium 15 through suitable couplings 23 and 25. As will be discussed in more detail presently, the SEL 11 is preferably driven in more than two distinct transverse modes; as noted previously, this may comprise multiple filamentation.

Figure 2:
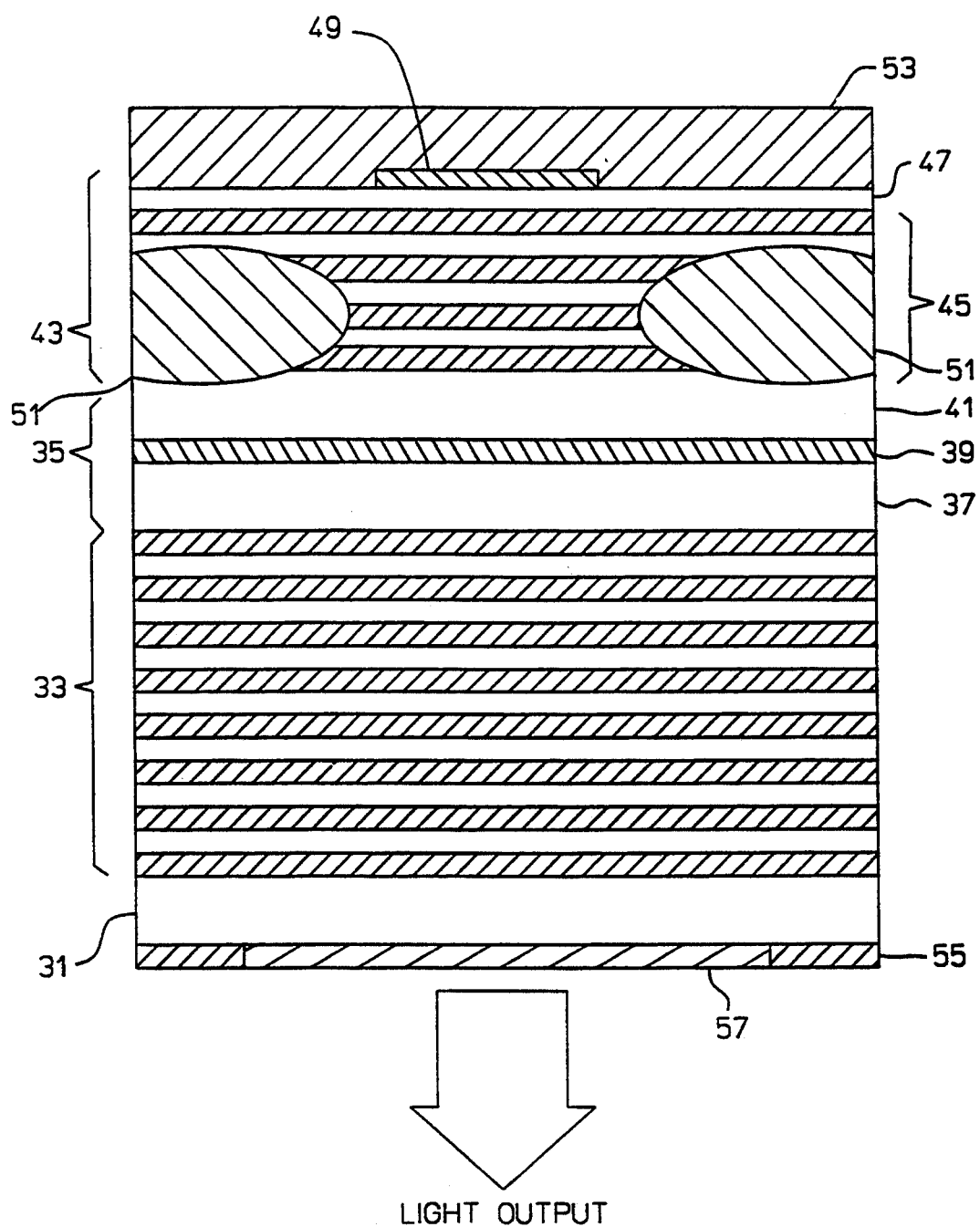
FIG. 2 is a cross-sectional view of a vertical-cavity, surface-emitting laser of the kind used in the communication system shown in FIG. 1.

A preferred method of fabricating the SEL 11 is illustrated in FIG. 2. The SEL is grown on an n+GaAs (gallium arsenide) substrate 31. A bottom output mirror, for example 18.5 pairs of n-doped GaAs/AlAs (gallium arsenide/aluminum arsenide) quarter-wave layers (generally designated 33 in the drawing), is epitaxially grown on the substrate 31. The interface between the layers is graded using an AlAs/GaAs/Al(0.3)Ga(0.7)As variable duty cycle short period superlattice ("SPSL"). The SPSL reduces any heterojunction band discontinuities at the GaAs/AlAs interface. The doping level is $1 \times 10^{18} cm^{-3}$ in uniform regions and $3 \times 10^{18} cm^{-3}$ in graded regions. For simplicity only a few of the 18.5 pairs of layers are shown in the figure. The reflectivity of the bottom mirror 33 is 98.9%.

Next an optical cavity structure 35 is grown. The cavity structure includes an n-cladding layer 37, a quantum well 39, and a p-cladding layer 41. The cladding layers 37 and 41 comprise Al(0.3)Ga(0.7)As doped to $1 \times 10^{18} cm^{-3}$, reduced to $5 \times 10^{17} cm^{-3}$ adjacent the quantum well 39. The quantum well 39 comprises 3 MQW of strained In(0.2)Ga(0.8)As (indium gallium arsenide) having a thickness of about 80 Å (Å=Angstrom), with GaAs barriers having a thickness of 100 Å.

Above the quantum well 35 is a highly-reflective top mirror 43. The reflectivity of the top mirror is greater than 99.96%. The top mirror 43 comprises, for example, 15 pairs of GaAs/AlAs quarter wave layers (generally designated 45), a phase matching layer 47, and an Au (gold) layer 49. A proton isolation region 51 surrounds the perimeter of the quarter wave layers 45. As with the bottom mirror 33, only a few of the quarter wave layers 45 are actually shown in FIG. 2. The interfaces between the quarter wave layers are graded in a manner generally similar to the grading of the interfaces in the bottom mirror 33. The doping levels are $1 \times 10^{18} cm^{-3}$ in uniform regions and $5 \times 10^{18} cm^{-3}$ in graded regions.

The phase matching layer 47, which is GaAs, compensates for phase delays that result from finite penetration of the optical field into the Au layer.

The Au layer 49 is about 2000 Å thick and is fabricated, after MBE growth of the underlying structure, as follows. First a 2000 Å layer of Au is deposited on the GaAs phase matching layer 47. Then a thick (more than 10 $\mu$m) Au button is plated on top to serve as a mask for proton isolation. The wafer is then proton implanted. Crystal structure damage that results from the proton implantation provides for current confinement and therefore gain guiding. Then another thick Au button 53 with a diameter of about 300 $\mu$m is plated on top. This button 53 is used for solder/die attachment of the completed device to a heat sink. The wafer is then lapped and polished to a diameter of 125 $\mu$m and an annular electrode 55 is patterned on the bottom. A quarter-wave anti-reflection coating 57 of $SiO_2$ (silicon dioxide) is deposited in the open region of the electrode 55.

An optical communication system embodying the principles of the invention was constructed using a relatively large-area SEL with a 25 $\mu$m opening coupled to an optical fiber. A physical discontinuity was deliberately introduced into the fiber; this discontinuity was a gap of several millimeters. The gap was adjustable to cause between 3 dB and 16 dB of loss. The length of the fiber between the SEL and the gap was 16 meters; this portion of the fiber was agitated with a shaker to simulate the effect of fiber movement. The bit error rate ("BER") was measured for gaps of various widths; the measured BERs were less than $10^{31\ 11}$ for losses up to 10 dB.

In the tests described herein, a wavelength of about 970 nanometers ("nm") was used. It will be apparent that the principles of the invention are equally applicable to devices that are operated at other wavelengths, and that the physical dimensions will change accordingly.

In another test the performance of the large-area SEL was compared with that of a smaller SEL having a 12 $\mu$m opening. The threshold currents were about 6.5 milliamps (mA) for the large SEL and 4.2 mA for the smaller. The threshold voltages were 2.7 and 4.5 volts, respectively. The output power at twice the threshold current was 3.6 milliwatts (mW) for the larger SEL and 2.8 mW for the smaller. The emission wavelength was about 970 nm.

The SELs were modulated directly by a 1 gigabit-per-second, non-return-to-zero ("NRZ") signal at a maximum of 2 volt amplitude and with a $2^{15}-1$ pseudo-random bit sequence through a bias-T. The bias levels were several times the respective threshold currents. The SELs were directly coupled into 50/125 graded index multimode fiber. The length of the fiber between the SEL and the gap was 16 meters, and the gap was adjusted for a 10 dB loss. An optical attenuator was inserted between the gap and the receiver to keep the optical power incident on the receiver at 6 dB above the receiver sensitivity.

The receiver was a Hewlett-Packard model 83442A receiver modified for multimode use with a 60 $\mu$m In-GaAs detector and a multimode FC/PC input connector. The receiver had a $-3$ dB bandwidth of 0.9 GHz. The AC-coupled receiver output was amplified to 2.0 volts before detection. The sensitivity of the receiver was $-23$ dBm for a receiver noise-limited BER of $10^{-9}$.

In this test configuration, the 25 $\mu$m SEL was operated for 16 hours without an error, resulting in a BER of less than $10^{-13}$. In other tests, the length of the fiber between the SEL and the gap (the gap was adjusted to a 10 dB loss) was varied between six and 406 meters and in every such instance the BER was less that $10^{-11}$. The 12 $\mu$m SEL was also able to achieve a BER of less than $10^{-11}$ with the gap adjusted to about a 4 dB loss.

A strongly-driven SEL with a relatively large surface area ("large surface area" means a surface opening larger than about eight $\mu$m) will operate in multiple, high-order transverse modes that are at slightly different wavelengths. As the size of the opening increases, so does the maximum number of transverse modes that can be obtained. Thus, an SEL with a 25 $\mu$m opening can be operated in significantly more transverse modes than an SEL with a 12 $\mu$m opening.

As the number of transverse modes increases, the optical bandwidth of the light produced by the laser also increases and the coherence of the light decreases. Speckle visibility measurements have shown that the speckle visibility from a large-area SEL is smaller than that of smaller SELs.

Despite operating in multiple transverse modes, the large-area SEL operates in a stable, single longitudinal mode. Longitudinal mode partition noise, which results from multiple longitudinal modes, is therefore not a significant problem with large-area SELs.

In one test, a 25 $\mu$m SEL was found to be operating in at least six distinct transverse modes at a drive current of 2.3 times the threshold current. The spectral width was $\Delta\lambda=0.75$ nm. When the drive current was reduced sufficiently to cause the laser to go into single mode operation, the spectral width was $\Delta\lambda<0.08$ nm; this measurement was limited by the resolution of the optical spectrum analyzer that was used for the test. In contrast, a 12 $\mu$m SEL was found to be operating in single mode at a drive current 1.5 times the threshold and in two transverse modes at a drive current 2.5 times the threshold.

From the foregoing it will be apparent that an optical communication system according to the invention is capable of carrying digital data at rates up to and exceeding 1.5 gigabits per second with very low bit error rates. The invention also offers the advantages, such as easy alignment, simple packaging and low cost, that are associated with systems using multimode optical media. In addition, SELs are expected to be easier and less expensive to manufacture than other kinds of lasers.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. An optical communication network comprising:
   a vertical-cavity, surface-emitting semiconductor laser structure having an aperture larger than eight micrometers through which an optical signal may be emitted;
   a power supply that provides a bias current to drive the laser into a multiple transverse mode of Operation in which the laser is responsive to a signal carrying data to provide an optical signal modulated with the data and to emit the optical signal through the aperture; and
   a multimode Optical medium optically coupled to the laser to carry the optical signal from the laser to a remotely-located receiver.

2. A network as in claim 1 and further comprising a receiver, optically coupled to the optical medium, that receives the modulated optical signal and recovers the data therefrom.

3. A network as in claim 1 wherein the multiple transverse mode of operation comprises more than two distinct transverse modes.

4. A network as in claim 1 wherein the multiple transverse mode of operation comprises multiple filamentation.

5. A network as in claim 1 wherein the multi-mode optical medium comprises an optical fiber.

6. A network as in claim 1 wherein the multi-mode optical medium comprises an optical waveguide.

* * * * *

(12) EX PARTE REEXAMINATION CERTIFICATE (8896th)
United States Patent
Hahn et al.

(10) Number: US 5,359,447 C1
(45) Certificate Issued: Mar. 13, 2012

(54) OPTICAL COMMUNICATION WITH VERTICAL-CAVITY SURFACE-EMITTING LASER OPERATING IN MULTIPLE TRANSVERSE MODES

(75) Inventors: Kenneth H. Hahn, Cupertino, CA (US); Michael R. T. Tan, Mountain View, CA (US); Shih-Yuan Wang, Palo Alto, CA (US)

(73) Assignee: Avago Technologies Fiber IP (Singapore) Pte. Ltd., Singapore (SG)

Reexamination Request:
No. 90/011,520, Mar. 1, 2011

Reexamination Certificate for:
Patent No.: 5,359,447
Issued: Oct. 25, 1994
Appl. No.: 08/083,739
Filed: Jun. 25, 1993

(51) Int. Cl.
- *H04B 10/13* (2006.01)
- *H01S 5/00* (2006.01)
- *H01S 5/183* (2006.01)

(52) U.S. Cl. .......................... 398/201; 372/38.1; 398/200
(58) Field of Classification Search .................... 359/154
See application file for complete search history.

(56) References Cited

To view the complete listing of prior art documents cited during the proceeding for Reexamination Control Number 90/011,520, please refer to the USPTO's public Patent Application Information Retrieval (PAIR) system under the Display References tab.

*Primary Examiner* — Christina Y Leung

(57) ABSTRACT

An optical communication system using a relatively large-area vertical-cavity surface-emitting laser. The laser has an opening larger than about eight micrometers and is coupled to a multimode optical fiber. The laser is driven into multiple transverse mode operation, which includes multiple filamentation as well as operation in a single cavity.

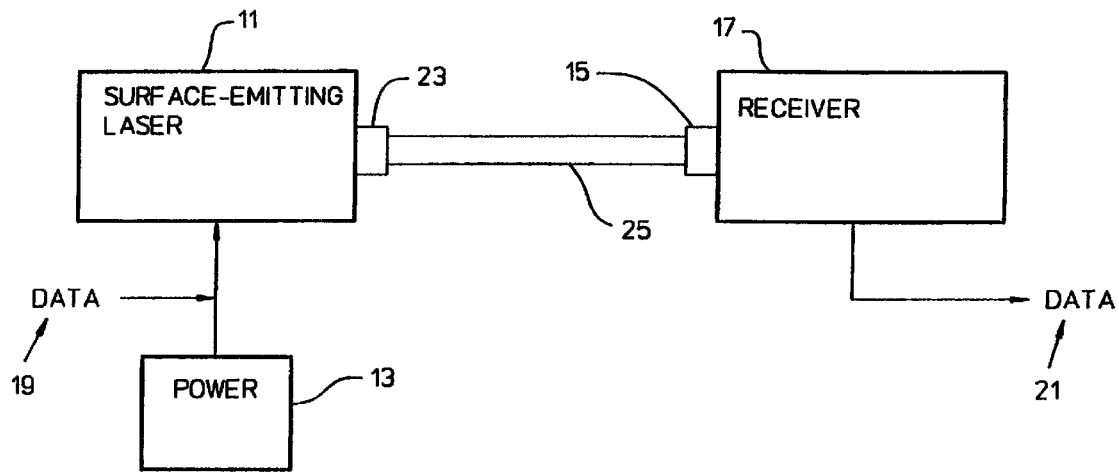

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-6 is confirmed.

New claims 7-22 are added and determined to be patentable.

*7. A network as in claim 1 wherein the vertical-cavity, surface-emitting semiconductor laser structure comprises at least one of GaAs and AlGaAs.*

*8. A network as in claim 1 wherein the vertical-cavity, surface-emitting semiconductor laser structure comprises first and second mirrors disposed on opposite sides of an optical cavity.*

*9. A network as in claim 8 wherein the first mirror has a higher reflectivity than the second mirror.*

*10. A network as in claim 8 wherein the optical cavity comprises a quantum well.*

*11. A network as in claim 1 wherein the aperture is 12 micrometers.*

*12. A network as in claim 1 wherein the the aperture is 25 micrometers.*

*13. A network as in claim 1 wherein the bias current provided by the power supply is about 2.3 times a threshold current of the vertical-cavity, surface-emitting laser structure.*

*14. A network as in claim 1 wherein the multiple transverse modes comprise at least six distinct transverse modes of operation.*

*15. A network as in claim 1 wherein the signal carrying data is a non-return-to-zero signal.*

*16. A network as in claim 1 wherein the signal carrying data has an amplitude of 2 volts.*

*17. A network as in claim 1 wherein the optical signal is modulated with the data at a rate of over 1.5 gigabits per second.*

*18. A network as in claim 1 wherein the multimode optical medium has a length of 100 meters or more.*

*19. A network as in claim 2 wherein the receiver recovers the data with a bit error rate of $10^{-11}$ or less.*

*20. A network as in claim 2 wherein the receiver recovers the data with a bit error rate of $10^{-13}$ or less.*

*21. A network as in claim 5 wherein the optical fiber is a 50/125 graded index multimode fiber.*

*22. A network as in claim 19 wherein the multimode optical medium has a length of 100 meters or more.*

\* \* \* \* \*